US012577669B2

(12) United States Patent
Lan

(10) Patent No.: US 12,577,669 B2
(45) Date of Patent: Mar. 17, 2026

(54) GAS INJECTION DEVICE OF SEMICONDUCTOR THERMAL PROCESSING EQUIPMENT AND SEMICONDUCTOR THERMAL PROCESSING EQUIPMENT

(71) Applicant: BEIJING NAURA MICROELECTRONICS EQUIPMENT CO., LTD., Beijing (CN)

(72) Inventor: Liguang Lan, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/689,767

(22) PCT Filed: Sep. 1, 2022

(86) PCT No.: PCT/CN2022/116481
§ 371 (c)(1),
(2) Date: Mar. 6, 2024

(87) PCT Pub. No.: WO2023/036046
PCT Pub. Date: Mar. 16, 2023

(65) Prior Publication Data
US 2025/0051917 A1 Feb. 13, 2025

(30) Foreign Application Priority Data
Sep. 7, 2021 (CN) .......................... 202111041581.X

(51) Int. Cl.
*C23C 16/455* (2006.01)
(52) U.S. Cl.
CPC .............................. *C23C 16/45578* (2013.01)

(58) Field of Classification Search
CPC . C23C 16/45578; C23C 16/455; C23C 16/54;
C23C 16/45551; C23C 16/545;
(Continued)

(56) References Cited

U.S. PATENT DOCUMENTS 5,160,543 A * 11/1992 Ishihara ................ C23C 16/452
118/725
5,532,190 A * 7/1996 Goodyear ........... C23C 16/5096
118/723 R
(Continued)

FOREIGN PATENT DOCUMENTS

CN 101118841 A 2/2008
CN 102437071 A 5/2012
(Continued)

OTHER PUBLICATIONS

The World Intellectual Property Organization (WIPO) International Search Report for PCT/CN2022/116481 Nov. 24, 2022 6 Pages (including translation).

*Primary Examiner* — Rudy Zervigon
(74) *Attorney, Agent, or Firm* — ANOVA LAW GROUP, PLLC

(57) ABSTRACT

The present disclosure provides a gas injection device of semiconductor thermal processing equipment and the semiconductor thermal processing equipment. The device includes an inlet pipe. A first pipe segment includes a first pipe wall and a second pipe wall embedded in the first pipe wall. A buffer space is formed between an inner wall of the first pipe wall and an outer wall of the second pipe wall. A plurality of first air holes are evenly distributed along a vertical direction on the first pipe wall, and the first air holes are communicated with the buffer space and the process chamber. A plurality of second air holes are arranged on the second pipe wall, and the second air holes are communicated
(Continued)

with the internal space of the second pipe wall and the buffer space.

12 Claims, 8 Drawing Sheets

(58) Field of Classification Search
CPC .............. C23C 16/4412; C23C 14/568; C23C 16/4401; H01L 21/67098; H01L 21/6719; H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745
USPC .............. 118/715, 719; 156/345.33, 345.32, 156/345.31
See application file for complete search history.

(56) References Cited

U.S. PATENT DOCUMENTS

| | | | | |
|---|---|---|---|---|
| 6,129,045 | A * | 10/2000 | Amano | C23C 16/4412 117/88 |
| 6,135,053 | A * | 10/2000 | Okamura | C23C 16/45578 118/723 E |
| 6,146,461 | A * | 11/2000 | Yang | C23C 16/455 432/235 |
| 6,199,568 | B1 * | 3/2001 | Arai | H01L 21/67086 134/186 |
| 7,900,580 | B2 * | 3/2011 | Kontani | C23C 16/45578 156/345.43 |
| 8,715,455 | B2 * | 5/2014 | Brcka | H01J 37/32449 156/345.39 |
| 9,163,311 | B2 * | 10/2015 | Hasegawa | C23C 16/45578 |
| 10,006,146 | B2 * | 6/2018 | Park | H01L 21/67201 |
| 10,364,498 | B2 * | 7/2019 | Terada | H01J 37/3244 |
| 2001/0025605 | A1 * | 10/2001 | Nagakura | C23C 16/45563 118/715 |
| 2004/0025786 | A1 * | 2/2004 | Kontani | C23C 16/45578 118/715 |
| 2007/0134415 | A1 * | 6/2007 | Hwang | H01L 21/02233 257/E21.283 |
| 2008/0035055 | A1 | 2/2008 | Dip et al. | |
| 2010/0055347 | A1 * | 3/2010 | Kato | C23C 16/4584 118/715 |
| 2011/0186984 | A1 * | 8/2011 | Saito | C23C 16/455 257/E23.012 |
| 2012/0180727 | A1 * | 7/2012 | Hasegawa | C23C 16/45576 118/730 |
| 2013/0167774 | A1 * | 7/2013 | Yang | C23C 16/45587 118/728 |
| 2014/0339330 | A1 * | 11/2014 | Hong | C23C 16/45578 239/589.1 |
| 2015/0275368 | A1 * | 10/2015 | Motoyama | C23C 16/45578 118/728 |
| 2015/0275369 | A1 * | 10/2015 | Terada | C30B 31/16 118/715 |
| 2017/0232457 | A1 * | 8/2017 | Fujino | C23C 16/45578 118/724 |
| 2023/0178393 | A1 * | 6/2023 | Fujita | H01L 21/67109 |

FOREIGN PATENT DOCUMENTS

| | | |
|---|---|---|
| CN | 103510045 A | 1/2014 |
| CN | 108070847 A | 5/2018 |
| CN | 110066989 A | 7/2019 |
| CN | 111725108 A | 9/2020 |
| CN | 112359343 A | 2/2021 |
| CN | 113755823 A | 12/2021 |
| JP | 2004363142 A | 12/2004 |
| JP | 2007317745 A | 12/2007 |
| JP | 2020017757 A | 1/2020 |
| TW | I489585 B | 6/2015 |
| TW | 201820526 A | 6/2018 |

* cited by examiner

GAS INJECTION DEVICE OF SEMICONDUCTOR THERMAL PROCESSING EQUIPMENT AND SEMICONDUCTOR THERMAL PROCESSING EQUIPMENT

CROSS-REFERENCE TO RELATED APPLICATIONS

This application is a national phase entry under 35 U.S.C. § 371 of International Application No. PCT/CN2022/116481, filed on Sep. 1, 2022, which claims priority to Chinese Application No. 202111041581.X filed on Sep. 7, 2021, the entire contents of both of which are incorporated herein by reference.

TECHNICAL FIELD

The present disclosure generally relates to the semiconductor manufacturing field and, more particularly, to a gas injection device of semiconductor thermal processing equipment and the semiconductor thermal processing equipment.

BACKGROUND

Semiconductor thermal processing equipment, such as vertical thermal processing equipment, is crucial equipment for forming a film on a surface of a semiconductor wafer. Performance indicators such as process stability, uniformity, and reliability directly impact electrical indicators and the yield of chips. When the vertical thermal processing equipment is applied to a film deposition process, to ensure a uniform distribution of the thicknesses of the films among the wafers, a process gas is provided to the positions of the wafers as evenly as possible.

In the existing vertical thermal processing equipment, a gas injection device occupies a relatively large space and may not be configured within a processing container with a predetermined size, and the gas injection device is close to the wafer boat. Thus, the space is not enough for the gas injected from the gas injection device to be uniformly mixed. Therefore, the uniform distribution of the gas cannot be ensured. Thus, gas volumes received by different wafers cannot be uniform, which can have a negative impact on the process result.

SUMMARY

The present disclosure is intended to solve one of the technical problems in the existing technology and provides a gas injection device of semiconductor thermal processing equipment and the semiconductor thermal processing equipment, which can improve the distribution uniformity of the process gas introduced into the process chamber to ensure different wafers to obtain uniform gas volumes to further ensure the thickness uniformity of the films formed on the wafers and the process results to be consistent.

To realize the purpose of the present disclosure, a gas injection device of semiconductor thermal processing equipment is provided and includes an inlet pipe configured to transfer a process gas into a process chamber of the semiconductor thermal processing equipment. The inlet pipe includes a first pipe segment and a second pipe segment. The first pipe segment is vertically arranged in the process chamber, an upper end of the first pipe segment is sealed, a lower end of the first pipe segment is connected to an upper end of the second pipe segment, and a lower end of the second pipe segment is configured to be connected to a gas source.

The first pipe segment includes a first pipe wall and a second pipe wall embedded in the first pipe wall. A buffer space is formed between an inner wall of the first pipe wall and an outer wall of the second pipe wall. An internal space of the second pipe wall is communicated with an internal space of the second pipe segment. A plurality of first air holes are arranged on the first pipe wall along a vertical direction at intervals. The first air holes are communicated with the buffer space and the process chamber. A plurality of second air holes are arranged on the second pipe wall. The second air holes are communicated with the internal space of the second pipe wall and the buffer space.

A change rule of an inner diameter of the second pipe wall in the vertical direction and/or an arrangement rule of the plurality of second air holes satisfy that gas outlet volumes at different positions in the vertical direction for the process gas flowing into the buffer space through the plurality of the second air holes to be the same.

In some embodiments, the arrangement rule of the plurality of second air holes includes that an arrangement density of the plurality of second air holes gradually increases from bottom to top.

In some embodiments, the plurality of second air holes are arranged into at least one second air hole column, each second air hole column includes a plurality of second air holes arranged along the vertical direction at intervals, and a vertical distance between two neighboring second air holes gradually decreases from bottom to top.

In some embodiments, the plurality of second air holes are arranged in a second air hole column, the plurality of first air holes are arranged in a first air hole column, and a gas outlet direction of the second air holes is opposite to a gas outlet direction of the first air holes.

In some embodiments, the change rule of the inner diameter of the second pipe wall in the vertical direction includes that the inner diameter of the second pipe wall gradually decreases from bottom to top;

or the second pipe wall includes a plurality of straight pipe segments arranged along the vertical direction in sequence, and the inner diameters of the plurality of straight pipe segments gradually decrease from bottom to top.

In some embodiments, the plurality of first holes are arranged along an axial direction of the first pipe wall into a plurality of first air hole columns, each first hole column includes a plurality of first air holes arranged along the vertical direction at intervals.

In some embodiments, the process chamber includes a support device, and the support device includes a plurality of carrier surfaces configured to carry wafers, and the plurality of carrier surfaces are arranged along the vertical direction at intervals; and the first pipe wall includes a partition corresponding to an interval between two neighboring carrier surfaces, and at least one first air hole is distributed in the partition.

In some embodiments, a height of an axis of the first air hole in the partition is the same as a height of a center point of the interval in the vertical direction.

In some embodiments, a pipe wall of the second pipe segment is integrally connected to the second pipe wall, an inner diameter of the second pipe segment is the same as the inner diameter of the second pipe wall, a first sealed member is arranged at the lower end of the first pipe wall, and the first sealed member is sealed and connected to an outer wall of the second pipe wall.

In some embodiments, the pipe wall of the second pipe segment is integrally connected to the first pipe wall, and an outer diameter and the inner diameter of the second pipe segment are respectively equal to an outer diameter and an inner diameter of the first pipe wall, a second sealed member is arranged at the lower end of the second pipe wall, and the second sealed member is sealed and connected to an inner wall of the first pipe wall.

In some embodiments, a diameter of the first air hole ranges between greater than or equal to 0.1 mm and less than or equal to 40 mm, a distance between two neighboring first air holes in the vertical direction ranges between greater than or equal to 1 mm and less than or equal to 200 mm.

In some embodiments, a diameter of the second air hole ranges between greater than or equal to 0.1 mm and less than or equal to 20 mm, a vertical distance between two neighboring second air holes in a same second air hole column ranges between greater than or equal to 1 mm and less than or equal to 500 mm.

As another technical solution, the present disclosure further provides semiconductor thermal processing equipment, including a process chamber and a support device arranged in the process chamber. The support device includes a plurality of carrier surfaces configured to carry wafers and arranged along the vertical direction at intervals. The semiconductor thermal processing equipment further includes at least one gas injection device, the gas injection device adopting the gas injection device of the present disclosure. The inlet pipe is arranged on a side of the support device and configured to introduce the process gas into the process chamber.

The present disclosure includes the following beneficial effects.

With the gas injection device for the semiconductor thermal processing equipment provided by the present disclosure, the change rule of the inner diameter of the second pipe wall of the inlet pipe in the vertical direction and the arrangement rule of the plurality of second air holes satisfy that the gas outlet volumes at different positions in the vertical direction for the process gas flowing into the buffer space from the plurality of second air holes are the same. When the process gas is introduced into the second pipe wall from bottom to top at the second pipe segment, the differences in the gas outlet volumes at the different positions in the vertical direction for the process gas flowing into the buffer space due to the pressure loss generated when the process gas flowing through the second air holes from bottom to top can be compensated. Meanwhile, with the buffer space between the inner wall of the first pipe wall and the outer wall of the second pipe wall, the process gas can be uniformly and sufficiently mixed to effectively improve the distribution uniformity of the process gas in the vertical direction flowing from the first air holes into the buffer space to ensure the different wafers to obtain the uniform gas volume. Thus, the thickness uniformity of the films formed on the wafers and the process results can be ensured to be consistent. In addition, the inlet pipe has the double-pipe wall structure, which can reduce the volume and the occupation space in the process chamber. Thus, the gas injection device can be applied to more types of process chambers.

The semiconductor heat treatment equipment of the present disclosure adopts the gas injection device of the present disclosure to ensure the different wafers to obtain the uniform gas volume to further ensure the thickness uniformity of the films formed on the wafers and the process results are consistent.

DETAILED DESCRIPTION OF THE EMBODIMENTS

To make those skilled in the art better understand the technical solution of the present disclosure, a gas injection device of semiconductor thermal processing equipment and the semiconductor thermal processing equipment can be described in detail in connection with the accompanying drawings.

In the vertical thermal processing equipment of the related technology, a gas injection device includes an inverted U-shaped injection pipe. A plurality of first air holes can be evenly distributed at two pipe segments on two sides of a bent position of the injection pipe and can be configured to inject a process gas into a process chamber. The first air holes at the two pipe segments can be staggered in a vertical direction to improve the uniformity of the gas outlet volume in the vertical direction. However, the U-shaped injection pipe can take a large space and cannot be configured within a processing container with a predetermined size. In addition, the U-shaped injection pipe is close to the wafer boat. Thus, the uniformity of the gas distribution cannot be ensured. Therefore, the gas volume obtained by different wafers can be uneven, which can have a negative impact on the process result.

First Embodiment

Figure 1:
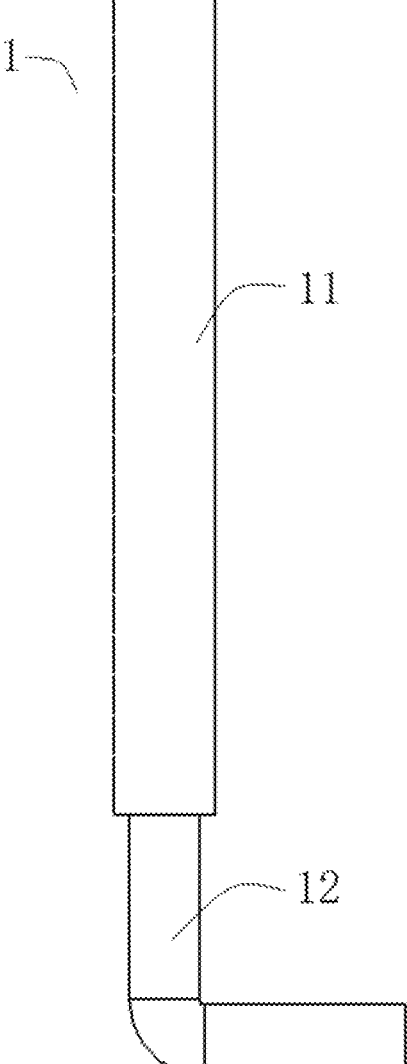
FIG. 1 illustrates a schematic structural diagram of a gas injection device of semiconductor thermal processing equipment according to a first embodiment of the present disclosure.

To address the above problem, please refer to FIG. 1. A gas injection device of the embodiment is applied to semiconductor thermal processing equipment, particularly verti-
cal thermal processing equipment. The gas injection device
includes an inlet pipe 1 configured to transfer a process gas
into a process chamber of the semiconductor thermal pro-
cessing equipment. The inlet pipe 1 includes a first pipe
segment 11 and a second pipe segment 12. The first pipe
segment 11 is vertically arranged in the process chamber. An
upper end of the first pipe segment 11 is sealed. A lower end
of the first pipe segment 11 is connected to an upper end of
the second pipe segment 12. A lower end of the second pipe
segment 12 is configured to be connected to a gas source
(not shown in the figure) for providing the process gas. In
some embodiments, the lower end of the second pipe
segment 12 passes through a chamber wall of the process
chamber, extends outside of the process chamber, and is
connected to the external gas source.

Figure 2:
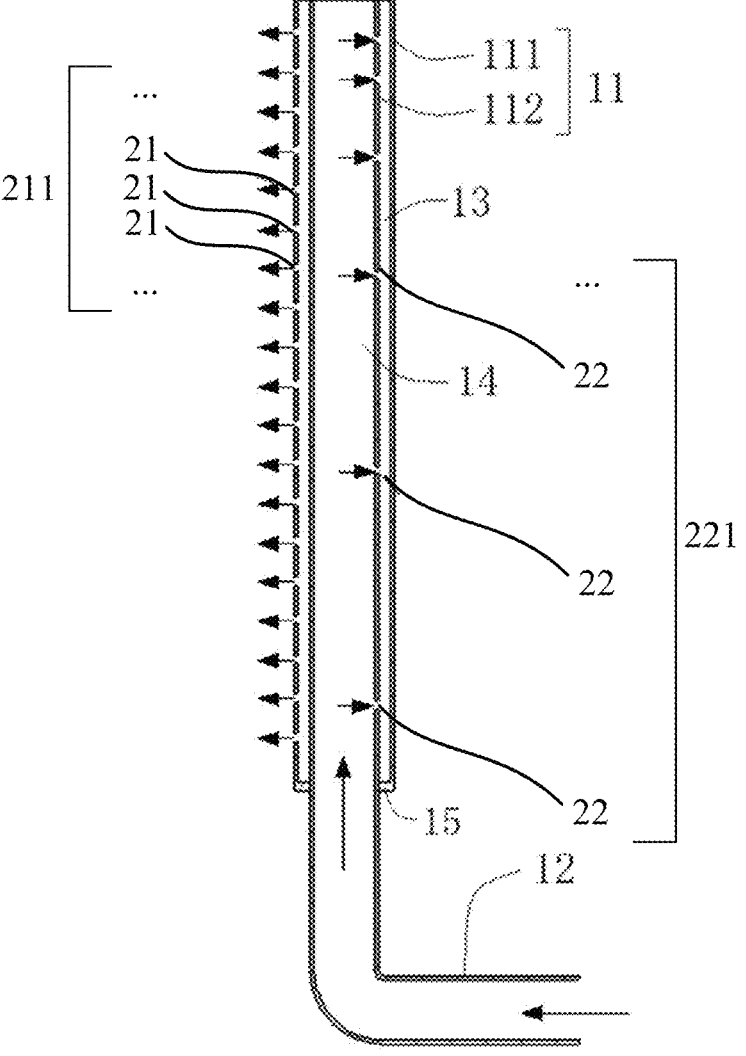
FIG. 2 illustrates a schematic cross-sectional diagram of a gas injection device of semiconductor thermal processing equipment along an axial direction according to the first embodiment of the present disclosure.
Figure 3:
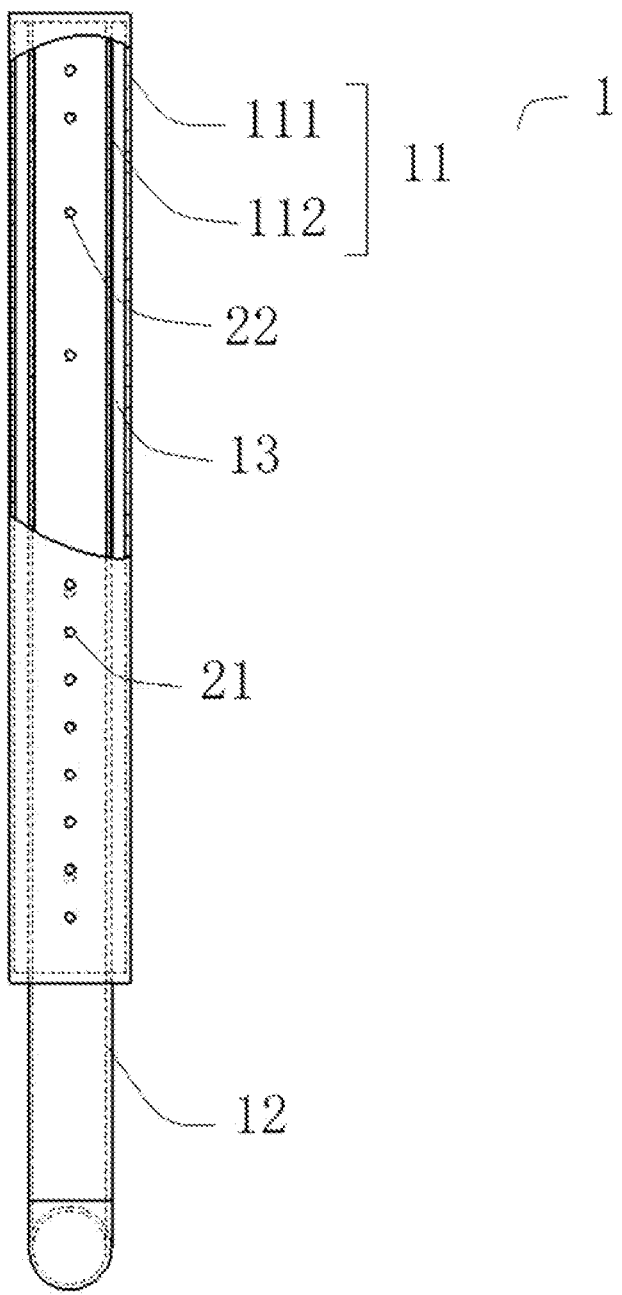
FIG. 3 illustrates a schematic partial cross-sectional diagram of a gas injection device of semiconductor thermal processing equipment according to the first embodiment of the present disclosure.

Please also refer to FIG. 2 and FIG. 3, the first pipe
segment 11 adopts a double-pipe wall structure. That is, the
first pipe segment 11 includes a first pipe wall 111 and a
second pipe wall 112 embedded in the first pipe wall 111. A
buffer space 13 is formed between the inner wall of the first
pipe wall 111 and the outer wall of the second pipe wall 112.
The internal space 14 of the second pipe wall 112 is
communicated with the internal space of the second pipe
segment 12.

In some embodiments, the pipe wall of the second pipe
segment 12 can be integrated with the second pipe wall 112,
and the inner diameter of the second pipe segment 12 can be
the same as the inner diameter of the second pipe wall 112.
Thus, at least a part of the second pipe segment 12 and the
second pipe wall 112 can form a continuous straight pipe to
cause the internal space of the second pipe wall 112 to be
communicated with the internal space of the second pipe
segment 12. By making the inner diameter of the second
pipe segment 12 same as the inner diameter of the second
pipe wall 112, a gas flow in the second pipe segment 12 can
flow steadily into the internal space 14 of the second pipe
wall 112 without generating gas disturbance or pressure loss
to facilitate the process gas quickly flowing to the upper end
of the second pipe wall 112 to improve the gas inlet
efficiency.

Additionally, a first sealed member 15 can be arranged at
the lower end of the first pipe wall 111. The first sealed
member 15 can be sealed and connected to the outer wall of
the second pipe wall 112 to ensure that the bottom of the
buffer space is sealed. The first sealed member 15, for
example, can be an end wall formed integrally with the first
pipe wall 111. An opening can be formed on the end wall for
the straight pipe formed by the second pipe segment 12 and
the second pipe wall 112 to pass through.

In some embodiments, as shown in FIG. 2, the upper end
of the first pipe wall 111 includes an end wall to ensure that
the top of the buffer space 13 is sealed. Moreover, the upper
end of the second pipe wall 112 abuts the end wall to ensure
that the top of the internal space 14 of the second pipe wall
112 is also sealed. Of course, in practical applications, an
end wall can also be separately provided at the upper end of
the second pipe wall 112 to seal the top of the internal space
14.

By adopting the double-pipe wall structure, the volume of
the inlet pipe 1 can be reduced, and the space occupied by
the inlet pipe 1 can be reduced, Thus, the inlet pipe 1 can be
applied to more types of process chambers.

A plurality of first air holes 21 can be arranged along the
vertical direction of the first pipe wall 111 at intervals. In
some embodiments, the first air holes 21 can be evenly
distributed on the first pipe wall 111. The first air holes 21 can be communicatively connected to the buffer space 13
and the process chamber. A plurality of second air holes 22
can be arranged on the second pipe wall 112. The second air
holes 22 can be communicatively connected to the internal
space 14 of the second pipe wall 112 and the buffer space 13.
The direction of the airflow is indicated by the arrows in
FIG. 2. The process gas provided by the gas source flows
through the internal space of the second pipe segment 12
into the internal space 14 of the second pipe wall 112, flows
from bottom to top in the space 14, and then flows into the
buffer space 13 through the second air holes 22. After the
process gas is evenly and sufficiently mixed in the buffer
space 13, the process gas flows into the process chamber
through the first air holes 21.

During the flowing process of the process gas from
bottom to top in the internal space 14, a part of the process
gas can flow out from the second air holes 22 each time the
process gas passes the second air holes 22. Thus, a certain
pressure loss can occur in the gas flow in the internal space
14. The pressure loss can be larger when the process gas
flows further upward. Thus, when the plurality of second air
holes 22 are arranged along the vertical direction at an even
interval, the process gas flowing into the buffer space 13 can
have differences in the gas outlet volumes at different
positions along the vertical direction. That is, the gas outlet
volume can gradually reduce from bottom to top. Thus, the
buffer space 13 can be configured to mix the process gas
evenly and sufficiently to improve the uniformity of the
distribution of the process gas flowing into the process
chamber from the first air holes 21 in the vertical direction
at a certain degree. In addition, the top of the second pipe
wall 112 is sealed, the process gas can only flow into the
buffer space 13 from the plurality of second air holes 22 on
the pipe wall and flows out from a side of the pipe wall.
Compared to the gas outlet from the top, it is more beneficial
for the process gas to expand in the vertical direction in the
buffer space 13 to further enhance the process gas to be
mixed evenly and sufficiently.

Based on this, to compensate the differences of the gas
outlets of the process gas flowing into the buffer space 13 at
different positions in the vertical direction caused by the
pressure loss of the gas flow in the interspace 14, the
plurality of second air holes 22 can be arranged to cause the
gas outlets amounts of the process gas flowing into the buffer
space 13 from the plurality of second air holes 22 to be the
same at different positions in the vertical direction. That is,
the differences in the gas outlets can be compensated
through the arrangement of the plurality of second air holes
22. Thus, different wafers can be ensured to obtain an even
gas volume to ensure the thickness uniformity and the
process result of the film formed on the wafer are consistent.

In some embodiments, the plurality of second air holes 22
can be arranged with an arrangement density of the plurality
of second air holes 22 increasing gradually from the bottom
to the top. The arrangement density of the plurality of second
air holes 22 can refer to the number of second air holes 22
arranged in a unit area at the second pipe wall 112. When the
number of second air holes 22 arranged in the unit area is
greater, the gas outlet volume of the area corresponding to
the unit area can be larger. When the number of second air
holes 22 arranged in the unit area is smaller, the gas outlet
volume of the area corresponding to the unit area can be
smaller. Based on this, by arranging the plurality of second
air holes 22 with the arrangement density increasing gradu-
ally from the bottom to the top, the gas outlet volume can be
compensated to improve the uniformity of the gas outlet volume of the process gas flowing into the buffer space at different positions in the vertical direction.

The plurality of second air holes 22 can be arranged in a plurality of methods to cause the arrangement density to gradually increase from the bottom to the top. For example, the plurality of second air holes 22 can be arranged at least in a column 221 of second air holes. Each column 221 of second air holes can include a plurality of second air holes 22 arranged along the axial direction of the second pipe wall 112 (i.e., the vertical direction) at intervals. In addition, a vertical distance between two neighboring second air holes 22 can gradually decrease from bottom to top. For example, the plurality of second air holes 22 in FIG. 2 are arranged in a column 221 of second air holes.

In some embodiments, as shown in FIG. 2, the plurality of second air holes 22 are arranged in a second air hole column 221, and the plurality of first air holes 21 are arranged in a first air hole column 211. The gas outlet direction of the second air holes 22 is opposite to the gas outlet direction of the first air holes 21. That is, an included angle between the axis of the second air hole 22 and the axis of the first air hole 21 is 180°. That is, the second air hole column 221 can be located on a side of the second pipe wall 112 away from the first air hole column 211. Then, the path for the process gas to flow from the second air hole 22 through the buffer space 13 to the first air hole 21 can be the longest. Thus, the process gas can be further enhanced to be mixed evenly and sufficiently.

It should be noted that in practical applications, the central angle between the axis of the second air hole 22 and the axis of the first air hole 21 in the horizontal plane can be freely set within the range of 0°-180°, as long as the uniformity of the distribution of the process gas flowing into the process chamber from the first air holes 21 in the vertical direction can be ensured.

Furthermore, in practical applications, the plurality of second air holes 22 can also be arranged in one or more second air hole columns 221, and the plurality of second air hole columns 221 can be arranged along a circumferential direction at intervals within a semi-circular area (0°-180° range) away from the first air hole column 211. Additionally, the first air holes 21 can also be arranged in one or more first air hole columns 211, and the plurality of first air hole columns 211 can be arranged along the circumferential direction at intervals within a semi-circular area (0°-180° range) away from the second air hole columns 221.

It also needs to be noted that the method of realizing the arrangement density of the plurality of second air holes 22 to gradually increase from bottom to top is not limited to the method above. In practical applications, the plurality of second air holes 22 can also arranged in any other arrangement methods, e.g., random arrangement, as long as the arrangement density of the plurality of second air holes 22 increases gradually from bottom to top.

In some optional embodiments, a support device can be arranged in the process chamber. The support device can include a plurality of carrier surfaces for carrying wafers. The plurality of carrier surfaces can be arranged along the vertical direction at intervals. The first pipe wall 111 can include a partition corresponding to an interval between two neighboring carrier surfaces. The partition can include at least one first air hole 21. For example, the support device in the process chamber can be a wafer boat (e.g., a wafer boat 105 in FIG. 8). The wafer boat can carry a plurality of wafers in the vertical direction. The surfaces of the wafer boat for carrying the wafers can be the carrier surfaces. By arranging at least one first air hole 21 at each of the partitions of the first pipe wall 111, the uniformity of the gas volume obtained by different wafers can be further improved.

In some embodiments, a height of the axis of the at least one first air hole 21 of the plurality of first air holes 21 within the partitions of the first pipe wall 111 can be the same as the height of a center point of the corresponding interval of the two neighboring carrier surfaces. In some embodiments, the heights of the axes of the plurality of first air holes 21 within the partitions of the first pipe wall 111 can be the same as the height of the center point of the interval of each two neighboring carrier surfaces. That is, the axes of all the first air holes 21 in a same partition can be at the same height, which is the same as the height of the center point of each two neighboring carrier surfaces. Thus, the distances between the first air hole 21 and the two neighboring carrier surfaces can be the same. Therefore, the path of the process gas flowing from the first air hole 21 to expand to the two neighboring carrier surfaces can be the same to further improve the uniformity of the gas volumes obtained by different wafers.

In some embodiments, the diameter of the first air hole 21 can range from greater than or equal to 0.1 mm to less than or equal to 40 mm. The distance of two neighboring first air holes 21 in the vertical direction can range from greater than or equal to 1 mm to smaller than or equal to 200 mm.

In some optional embodiments, the diameter of the second air hole 22 can range from greater than or equal to 0.1 mm to less than or equal to 40 mm. The vertical distance of two neighboring second air holes 22 of the same second air hole column 221 can range from greater than or equal to 1 mm to smaller than or equal to 500 mm.

Second Embodiment

Figure 4:
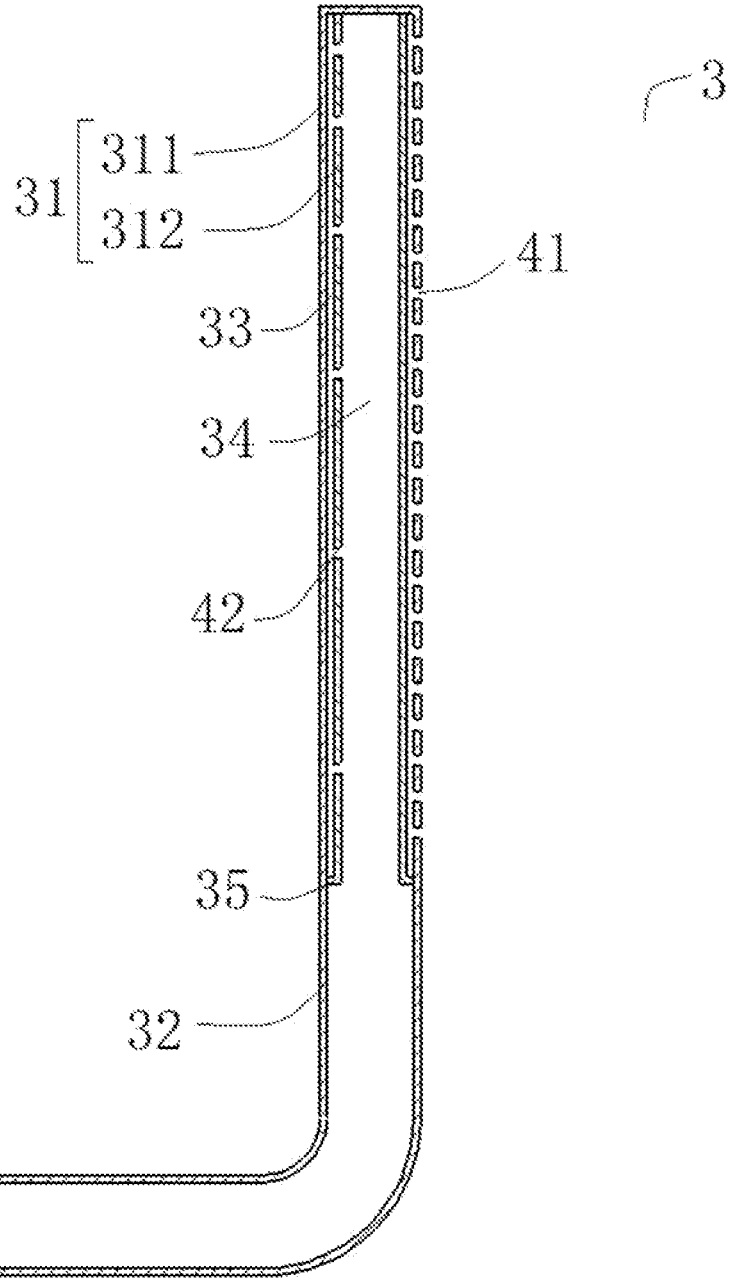
FIG. 4 illustrates a schematic cross-sectional diagram of a gas injection device of semiconductor thermal processing equipment along an axial direction according to a second embodiment of the present disclosure.
Figure 5:
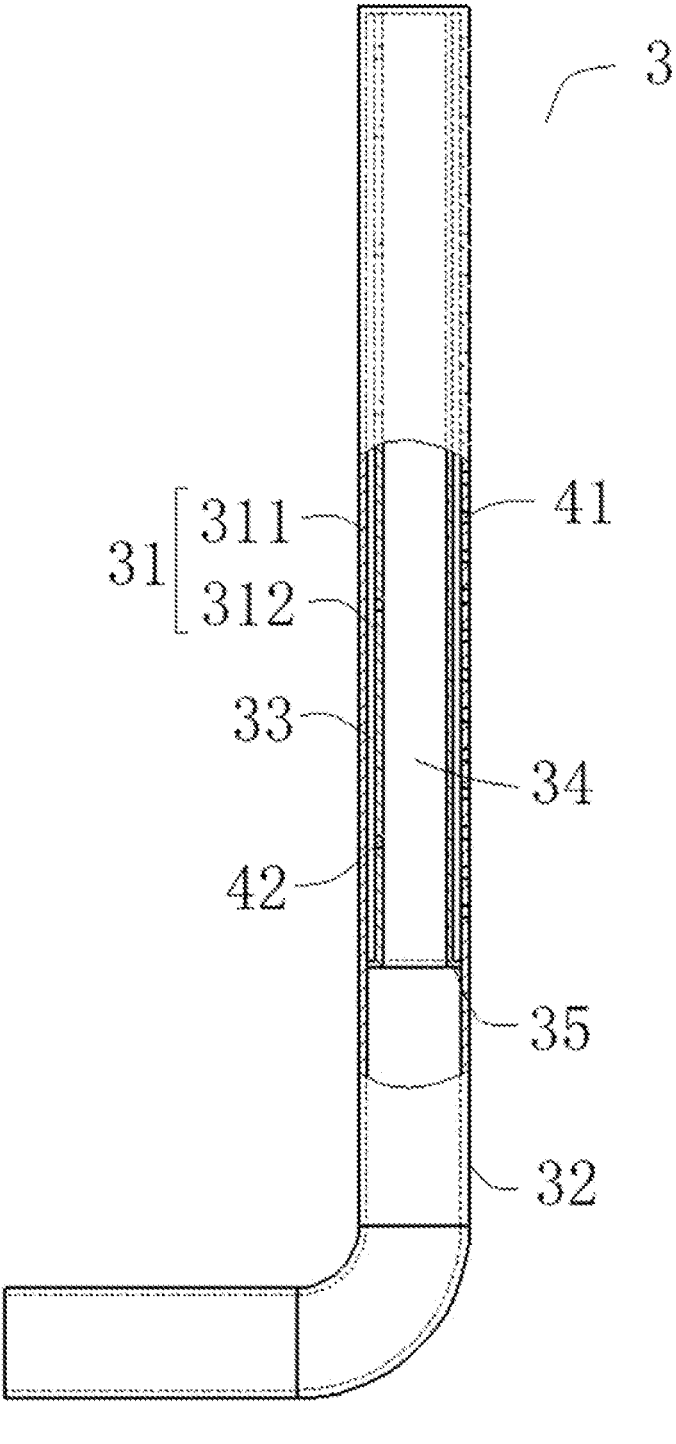
FIG. 5 illustrates a schematic partial cross-sectional diagram of a gas injection device of semiconductor thermal processing equipment according to the second embodiment of the present disclosure.

Please refer to FIG. 4 and FIG. 5, a gas injection device provided by the embodiment, compared to the first embodiments, also includes an inlet pipe 3. The inlet pipe 3 includes a first pipe segment 31 and a second pipe segment 32. The first pipe segment 31 is arranged vertically in the process chamber. The upper end of the first pipe segment 31 can be sealed. The lower end of the first pipe segment 31 is connected to the upper end of the second pipe segment 32. The lower end of the second pipe segment 32 can be configured to be connected to the gas source (not shown in the figure) for providing the process gas.

Moreover, the first pipe segment 31 can have a double-pipe wall structure. That is, the first pipe segment 31 includes a first pipe wall 311 and a second pipe wall 312 embedded in the first pipe wall 311. A buffer space 33 can be formed between the inner wall of the first pipe wall 311 and the outer wall of the second pipe wall 312. The internal space 34 of the second pipe wall 312 can be communicated with the internal space of the second pipe segment 32.

As shown in FIG. 4, the pipe wall of the second pipe segment 32 is integrally connected to the first pipe wall 311, and the outer diameter and inner diameter of the second pipe segment 32 are equal to the outer diameter and inner diameter of the first pipe wall 311, respectively. Thus, at least a part of the second pipe segment 32 and the first pipe wall 311 form a continuous straight pipe. The second pipe wall 312 is arranged inside the first pipe wall 311. The bottom of the second pipe wall 312 is open to allow the internal space 34 to be communicated with the internal space of the second pipe segment 32. By causing the outer diameter and the inner diameter of the second pipe segment 32 to be equal to the outer diameter and the inner diameter of the first pipe wall 311, respectively, the volume can be further reduced, and the occupied space in the process chamber can be reduced. The gas injection device can be applied in more types of process chambers.

Moreover, the lower end of the second pipe wall 312 can include a second sealed member 35. The second sealed member 35 can be sealed and connected to the inner wall of the first pipe wall 311 to ensure that the bottom of the buffer space 33 is sealed. The second sealed member 35, for example, can be an annular convex flange formed integrally with the second pipe wall 312. The annular convex flange can abut against the inner wall of the first pipe wall 311 to ensure that the bottom of the buffer space 33 is sealed.

A plurality of first air holes 41 can be evenly distributed along the vertical direction on the first pipe wall 311. The first air holes 41 can be communicated with the buffer space 33 and the process chamber. A plurality of second air holes 42 can be arranged on the second pipe wall 312. The second air holes 42 can be communicated with the internal space 34 of the second pipe wall 312 and the buffer space 33. The process gas provided by the gas source can flow from the second pipe segment 32 into the internal space of the second pipe wall 312, flow from bottom to top in the internal space 34, and flow into the buffer space 33 through the second air holes 42. After being evenly and sufficiently mixed in the buffer space 33, the process gas can flow into the process chamber through the first air holes 41.

Other structures and functions of the gas injection device of the present embodiment are the same as those in the first embodiment and are not repeated here.

Third Embodiment

Figure 6:
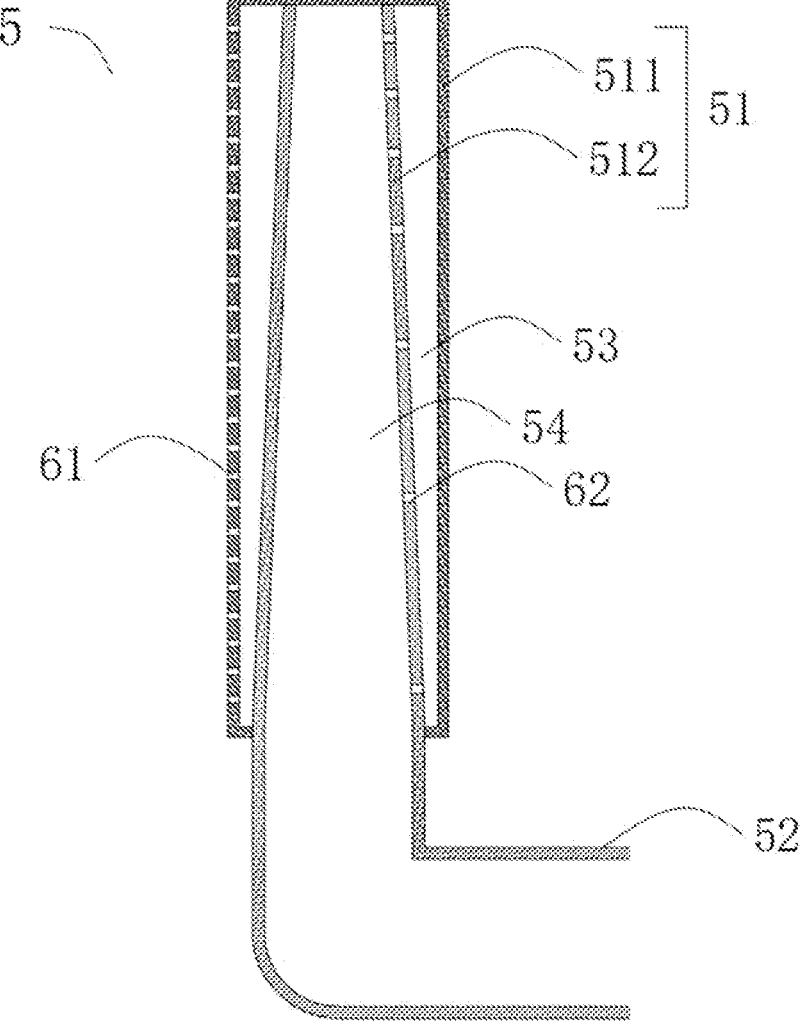
FIG. 6 illustrates a schematic cross-sectional diagram of a gas injection device of semiconductor thermal processing equipment along an axial direction according to a third embodiment of the present disclosure.

Please refer to FIG. 6, the gas injection device of the present embodiment, compared to the first embodiment, also includes an inlet pipe 5. The inlet pipe 5 includes a first pipe segment 51 and a second pipe segment 52. The first pipe segment is arranged in the process chamber. The upper end of the first pipe segment 51 is sealed. The lower end of the first pipe segment 51 is connected to the upper end of the second pipe segment 52. The lower end of the second pipe segment 52 is configured to be connected to the gas source (not shown in the figure) for providing the process gas.

Moreover, the first pipe section 51 can have the double-pipe wall structure. That is, the first pipe segment 51 can include a first pipe wall 511 and a second pipe wall 512 embedded in the first pipe wall 511. The inner wall of the first pipe wall 511 and the outer wall of the second pipe wall 512 can form a buffer space 53. An internal space 54 of the second pipe wall 512 can be communicated with an internal space of the second pipe segment 52.

To compensate for the differences in gas outlets at different positions in the vertical direction of the process gas flowing into the buffer space 53 due to the pressure loss generated by the gas flow in the internal space 54, the inner diameter of the second pipe wall 512 can change in the vertical direction to cause the gas outlet at the different positions in the vertical direction of the process gas flowing into the buffer space 53 from the plurality of second air holes 62 to the same. That is, the differences in the gas outlet can be compensated by setting the change rule of the inner diameter of the second pipe wall 512 in the vertical direction. Thus, different wafers can be ensured to obtain the event gas volumes to ensure the thickness uniformity of the films formed on the wafers and the process results are consistent.

In some embodiments, as shown in FIG. 6, the change rule of the inner diameter of the second pipe wall 512 in the vertical direction includes that the inner diameter of the second pipe wall 512 gradually decreases from bottom to top. For example, as shown in FIG. 6, the second pipe wall 512 is in a conical shape. Since the inner diameter of the second pipe wall 512 is getting smaller, the gas flow speed can be larger. Thus, reducing the inner diameter of the second pipe wall 512 can compensate the gas outlet to improve the uniformity of the gas outlet at different positions in the vertical direction for the process gas.

Figure 7:
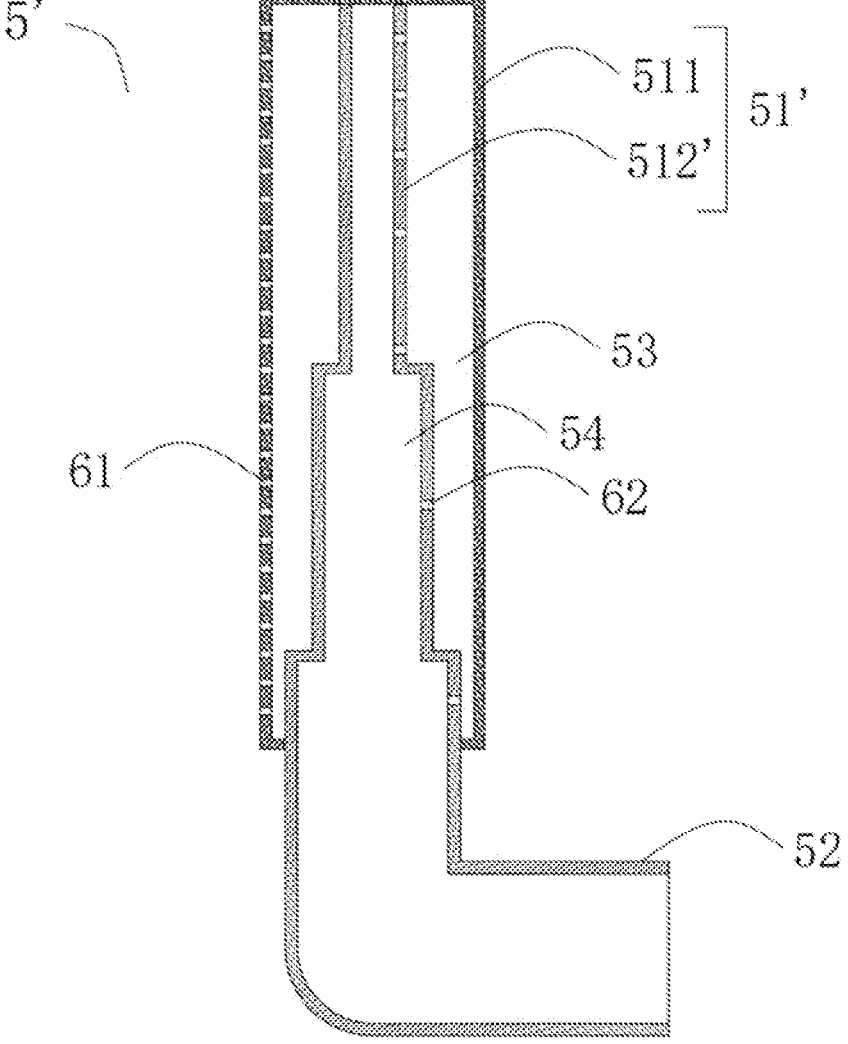
FIG. 7 illustrates a schematic cross-sectional diagram of another gas injection device of semiconductor thermal processing equipment along an axial direction according to the third embodiment of the present disclosure.

As a variant of the present embodiment, as shown in FIG. 7, similar to the inlet pipe 5, the inlet pipe 5' also includes a first pipe segment 51' and a second pipe segment 52'. The first pipe segment 51 includes a first pipe wall 511' and a second pipe wall 512'. The only difference is the change rule of the inner diameter of the second pipe wall 512' in the vertical direction. The change rule can include that the second pipe wall 512' includes a plurality of straight pipe segments arranged in sequence in the vertical direction, and the inner diameters of the plurality of straight pipe segments gradually decrease from bottom to top. Thus, the inner diameter of the second pipe wall 512' can also be reduced from bottom to top to compensate the gas outlet to improve the uniformity of the gas outlet volumes at different positions in the vertical direction for the process gas flowing into the buffer space 53.

A plurality of first air holes 61 can be evenly distributed along the vertical direction on the first pipe wall 511, and the first air holes 61 can be communicated with the buffer space 53 and the process chamber. A plurality of second air holes 62 can be arranged on the second pipe wall 512, and the second air holes 62 can be communicated with the internal space 54 of the second pipe wall 512 and the buffer space 53. The process gas provided by the gas source can flow into the internal space 54 of the second pipe wall 512 through the second pipe segment 52, flow from bottom to top in the space 54, and then flow into the buffer space 53 through the second air holes 62. After being uniformly and sufficiently mixed in the buffer space 53, the process gas can flow into the process chamber through the first air holes 61.

It should be noted that, in practical applications, the change rule of the inner diameter of the second pipe wall 512 in the vertical direction and/or the arrangement rule of the plurality of second air holes 62 can be set to compensate for the differences of the gas output amounts. For example, in FIG. 6 and FIG. 7, based on the reduction of the inner diameter of the second pipe wall 512 from bottom to top, the vertical distance between two neighboring second air holes 62 gradually decreases from bottom to top. By combining these two rules, the gas outlet volume can be more effectively compensated. Of course, in practical applications, at least one of the two rules can be freely selected as needed.

It also needs to be noted that, in FIG. 6 and FIG. 7, the pipe wall of the second pipe segment 52 is integrally connected to the second pipe wall 512 (or the second pipe wall 512'). However, the present disclosure is not limited to this. In practical applications, a structure similar to the second embodiment can also be employed. That is, the pipe wall of the second pipe segment 52 can be integrally connected to the first pipe wall 511.

Other structures and functions of the gas injection device of the present embodiment can be the same as those in the first and second embodiments and are not repeated here.

In summary, in the gas injection device of the semiconductor thermal processing equipment of embodiments of the present disclosure, the change rule of the inner diameter of the second pipe wall of the inlet pipe in the vertical direction and/or the arrangement rule of the plurality of second air holes can satisfy that the gas outlet volumes at different positions in the vertical direction for the process gas flowing into the buffer space through the plurality of second air holes can be the same, and when the process gas is introduced into the inside of the second pipe wall from bottom to top at the second pipe segment, the differences in the gas outlet volumes at different positions in the vertical direction for the process gas flowing into the buffer space due to the pressure loss generated when the process gas flow through the second air holes from bottom to top can be compensated. Meanwhile, the process gas can be uniformly and sufficiently mixed in the buffer space between the inner wall of the first pipe wall and the outer wall of the second pipe wall, which can effectively improve the distribution uniformity in the vertical direction for the process gas flowing into the process chamber from the first air holes to ensure that different wafers can obtain uniform gas volumes. Thus, the thickness uniformity of the films formed on the wafers and the process results can be consistent. In addition, with the double pipe wall structure adopted by the inlet pipe, the volume can be reduced, and the occupation space in the process chamber can be reduced. Thus, the gas injection device can be applied to more types of process chambers.

Fourth Embodiment

Figure 8:
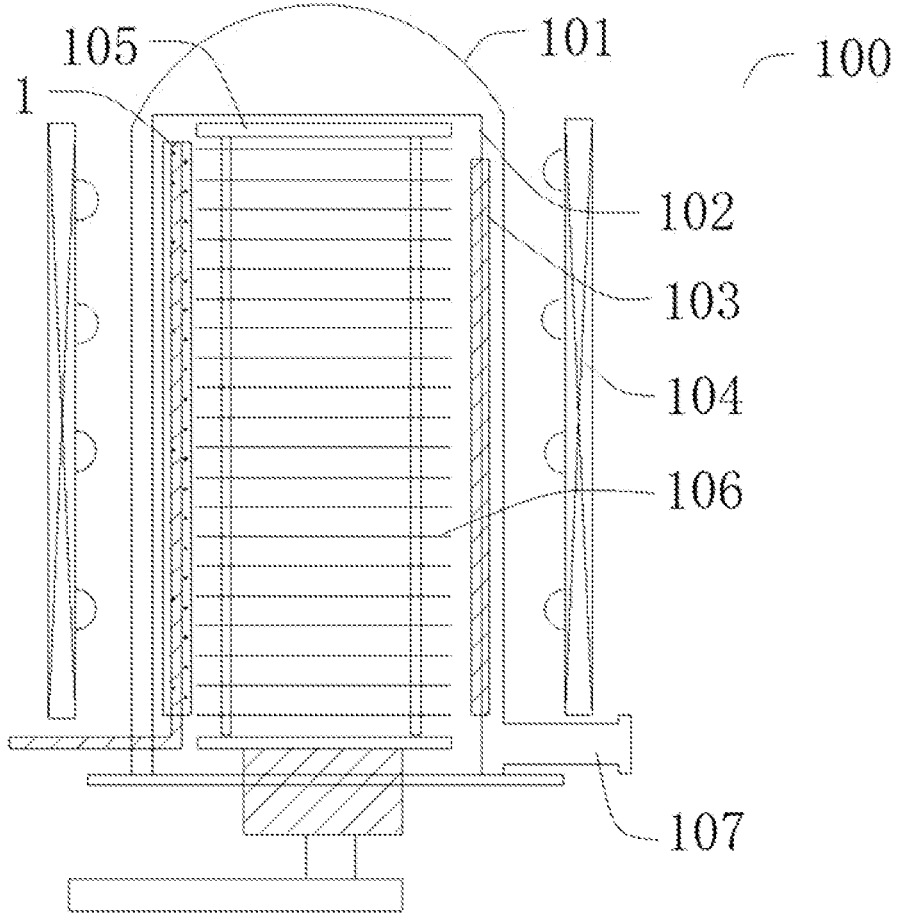
FIG. 8 illustrates a schematic structural diagram of a semiconductor thermal processing equipment according to a fourth embodiment of the present disclosure.

Please refer to FIG. 8, semiconductor thermal processing equipment 100 of the present embodiments, for example, a vertical thermal processing equipment, includes an outer pipe 101, an inner pipe 102 embedded in the outer pipe 101, and a heater 104 sleeved at the outer pipe 101. A process chamber is formed inside the inner pipe 102. A support device can be arranged in the process chamber. The support device includes a plurality of carrier surfaces for carrying the wafers, which are arranged at intervals along the vertical direction. The support device, for example, can be a wafer boat 105. The wafer boat 105 can carry a plurality of wafers 106 in the vertical direction. The surface of the wafer boat 105 for carrying the wafer 106 can be, for example, the carrier surfaces.

The semiconductor thermal processing equipment 100 can further include at least one gas injection device, and the gas injection device adopts the gas injection device provided in the embodiments above. In the gas injection device, by taking the gas inlet pipe 1 of the first embodiment as an example, as shown in FIG. 8, the gas inlet pipe 1 is arranged on a side of the wafer boat 105 and configured to introduce the process gas into the process chamber.

It should be noted that, in practical applications, the number of the above gas injection devices can be designed according to the types of gases required for the process. For example, when the semiconductor thermal processing equipment 100 is applied to an oxidation process, at least two gas injection devices can be included. In some embodiments, the semiconductor thermal process equipment can include a gas injection device configured to introduce an oxidative gas such as $O_2$ into the process chamber, a gas injection device configured to introduce a reductive gas such as $H_2$ into the process chamber, and a gas injection device configured to introduce an inert gas such as $N_2$ into the process chamber.

In some embodiments, combining FIG. 2 and FIG. 8, a first air hole 21 is distributed in a partition on the first pipe wall 111 corresponding to an interval between two neighboring carrier surfaces. The height of the axis of the first air hole 21 can be the same as the height of the center point of the interval between the two neighboring carrier surfaces in the vertical direction. Thus, the distances between the first air hole 21 and the two neighboring carrier surfaces can be made the same. Thus, the paths of the process gas expanding to the two neighboring carrier surfaces flowing out from the first air hole 21 can be the same to further improve the uniformity of the gas volumes obtained by different wafers 106.

In some embodiments, as shown in FIG. 8, a gas exhaust gap 103 is arranged on a side of the inner pipe 102 away from the inlet pipe 1. A gas exhaust channel 107 is arranged at a position facing the gas exhaust gap 103 at the bottom of the outer pipe 101. The gas in the process chamber can be exhausted passing through the gas exhaust gap 103 and the gas exhaust channel 107 in sequence.

The semiconductor thermal processing equipment of the present embodiment can ensure that the different wafers can obtain a uniform gas volume by adopting the gas injection device of the embodiments above to further ensure the thickness uniformity of the film formed on the wafer and the process results to be consistent.

It is understood that the above embodiments are merely illustrative exemplary embodiments adopted to explain the principles of the present disclosure. However, the present disclosure is not limited to this. For those ordinary skill in the art, various modifications and improvements made without departing from the spirit and essence of the present disclosure are within the scope of the present disclosure.

What is claimed is:

1. A gas injection device for semiconductor thermal processing equipment, comprising an inlet pipe configured to transfer a process gas into a process chamber of the semiconductor thermal processing equipment and including:
   a first pipe segment arranged vertically in the process chamber and a second pipe segment;
   wherein:
   an upper end of the first pipe segment is sealed, a lower end of the first pipe segment is connected to an upper end of the second pipe segment, and a lower end of the second pipe segment is configured to be connected to a gas source;
   the first pipe segment includes a first pipe wall and a second pipe wall embedded in the first pipe wall, a buffer space is formed between an inner wall of the first pipe wall and an outer wall of the second pipe wall, an internal space of the second pipe wall is communicated with an internal space of the second pipe segment, a plurality of first air holes are arranged on the first pipe wall along a vertical direction at intervals, the first air holes are communicated with the buffer space and the process chamber, a plurality of second air holes are arranged on the second pipe wall, and the second air holes are communicated with the internal space of the second pipe wall and the buffer space;
   a change rule of an inner diameter of the second pipe wall in the vertical direction satisfies that gas outlet volumes at different positions in the vertical direction for the process gas flowing into the buffer space through the plurality of the second air holes are the same; and
   the change rule of the inner diameter of the second pipe wall in the vertical direction includes that the second pipe wall includes a plurality of straight pipe segments arranged along the vertical direction in sequence, and the inner diameters of the plurality of straight pipe segments gradually decrease from bottom to top.

2. The gas injection device according to claim 1, wherein an arrangement density of the plurality of second air holes gradually increases from bottom to top.

3. The gas injection device according to claim 2, wherein:
the plurality of second air holes are arranged into at least one second air hole column;
each second air hole column includes a plurality of second air holes arranged along the vertical direction at intervals; and
a vertical distance between two neighboring second air holes gradually decreases from bottom to top.

4. The gas injection device according to claim 3, wherein:
the plurality of second air holes are arranged in a second air hole column;
the plurality of first air holes are arranged in a first air hole column; and
a gas outlet direction of the second air holes is opposite to a gas outlet direction of the first air holes.

5. The gas injection device according to claim 1, wherein:
the plurality of first air holes are arranged along an axial direction of the first pipe wall into a plurality of first air hole columns; and
each first air hole column includes a plurality of first air holes arranged along the vertical direction at intervals.

6. The gas injection device according to claim 1, wherein:
at least one first air hole of the plurality of first air holes is distributed in a portion of the first pipe wall facing a gap between two neighboring carrier surfaces; and
the carrier surfaces are surfaces for carrying wafers of a support device in the process chamber.

7. The gas injection device according to claim 6, wherein a height of a central axis of the first air hole in the portion of the first pipe wall is the same as a height of a center point of the gap in the vertical direction.

8. The gas injection device according to claim 1, wherein:
a pipe wall of the second pipe segment is integrally connected to the second pipe wall;
an inner diameter of the second pipe segment is the same as the inner diameter of at least a portion of the second pipe wall;
a first sealed member is arranged at the lower end of the first pipe wall; and
the first sealed member is sealed and connected to an outer wall of the second pipe wall.

9. The gas injection device according to claim 1, wherein:
the pipe wall of the second pipe segment is integrally connected to the first pipe wall;
an outer diameter and the inner diameter of the second pipe segment are respectively equal to an outer diameter and an inner diameter of the first pipe wall;
a second sealed member is arranged at the lower end of the second pipe wall; and
the second sealed member is sealed and connected to an inner wall of the first pipe wall.

10. The gas injection device according to claim 1, wherein:
a diameter of the first air hole ranges between greater than or equal to 0.1 mm and less than or equal to 40 mm; and a distance between two neighboring first air holes in the vertical direction ranges between greater than or equal to 1 mm and less than or equal to 200 mm.

11. The gas injection device according to claim 1, wherein:
a diameter of the second air hole ranges between greater than or equal to 0.1 mm and less than or equal to 20 mm; and
a vertical distance between two neighboring second air holes in a same second air hole column ranges between greater than or equal to 1 mm and less than or equal to 500 mm.

12. Semiconductor thermal processing equipment, comprising a process chamber, a support device arranged in the process chamber and including a plurality of carrier surfaces configured to carry wafers and arranged along the vertical direction at intervals, and at least one gas injection device including an inlet pipe arranged on a side of the support device and configured to introduce a process gas into the process chamber and including:
a first pipe segment arranged vertically in the process chamber and a second pipe segment;
wherein:
an upper end of the first pipe segment is sealed, a lower end of the first pipe segment is connected to an upper end of the second pipe segment, and a lower end of the second pipe segment is configured to be connected to a gas source;
the first pipe segment includes a first pipe wall and a second pipe wall embedded in the first pipe wall, a buffer space is formed between an inner wall of the first pipe wall and an outer wall of the second pipe wall, an internal space of the second pipe wall is communicated with an internal space of the second pipe segment, a plurality of first air holes are arranged on the first pipe wall along a vertical direction at intervals, the first air holes are communicated with the buffer space and the process chamber, a plurality of second air holes are arranged on the second pipe wall, and the second air holes are communicated with the internal space of the second pipe wall and the buffer space;
a change rule of an inner diameter of the second pipe wall in the vertical direction satisfies that gas outlet volumes at different positions in the vertical direction for the process gas flowing into the buffer space through the plurality of the second air holes are the same; and
the change rule of the inner diameter of the second pipe wall in the vertical direction includes that the second pipe wall includes a plurality of straight pipe segments arranged along the vertical direction in sequence, and the inner diameters of the plurality of straight pipe segments gradually decrease from bottom to top.

\* \* \* \* \*